(12) United States Patent
Wang

(10) Patent No.: US 11,362,214 B2
(45) Date of Patent: Jun. 14, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 22 days.

(21) Appl. No.: 16/861,381

(22) Filed: Apr. 29, 2020

(65) Prior Publication Data
US 2020/0343386 A1 Oct. 29, 2020

(30) Foreign Application Priority Data

Apr. 29, 2019 (CN) .......................... 201910356172.5

(51) Int. Cl.
*H01L 29/786* (2006.01)
*H01L 29/06* (2006.01)
(Continued)

(52) U.S. Cl.
CPC .................. *H01L 29/78609* (2013.01); *H01L 21/02532* (2013.01); *H01L 21/02546* (2013.01); *H01L 21/02603* (2013.01); *H01L 21/26513* (2013.01); *H01L 21/26546* (2013.01); *H01L 21/30604* (2013.01); *H01L 21/30612* (2013.01); *H01L 29/0673* (2013.01); *H01L 29/42392* (2013.01); *H01L 29/78681* (2013.01); *H01L 29/78684* (2013.01); *H01L 29/78696* (2013.01)

(58) Field of Classification Search
CPC ........... H01L 29/78609; H01L 29/0673; H01L 29/42392; H01L 29/78681; H01L 29/78684; H01L 29/78696; H01L 21/26546; H01L 21/02532; H01L 21/02546; H01L 21/30604; H01L 21/30612; H01L 21/26513; H01L 21/02603; H01L 21/30621; H01L 21/0262; H01L 29/785; H01L 29/66795; H01L 29/0603
See application file for complete search history.

(56) References Cited

U.S. PATENT DOCUMENTS

2018/0315817 A1* 11/2018 Van Dal ............ H01L 29/66439
2020/0294866 A1*  9/2020 Cheng ................. H01L 29/4966
2021/0305362 A1*  9/2021 Bouche ............... H01L 27/0886

* cited by examiner

*Primary Examiner* — Edward Chin
(74) *Attorney, Agent, or Firm* — Anova Law Group, PLLC

(57) ABSTRACT

The present disclosure provides a semiconductor device and a fabrication method. The method includes: providing a substrate; forming at least one sacrificial layer and at least one liner layer, that are alternately stacked over each other, on the substrate; etching the at least one liner layer and the at least one sacrificial layer until the substrate is exposed, to form a plurality of fins, discretely arranged on the substrate; and etching a portion of a thickness of the substrate, such that a width of the etched portion of the substrate at a bottom of the at least one sacrificial layer is less than a width of the at least one liner layer of the plurality of fins.

14 Claims, 8 Drawing Sheets

(51) Int. Cl.
*H01L 29/423* (2006.01)
*H01L 21/265* (2006.01)
*H01L 21/02* (2006.01)
*H01L 21/306* (2006.01)

SEMICONDUCTOR DEVICE AND FABRICATION METHOD THEREOF

CROSS-REFERENCES TO RELATED APPLICATION

This application claims the priority of Chinese Patent Application No. 201910356172.5, filed on Apr. 29, 2019, the content of which is incorporated herein by reference in its entirety.

TECHNICAL FIELD

The present disclosure generally relates to the field of semiconductor manufacturing and, more particularly, to a semiconductor device and a fabrication method thereof.

BACKGROUND

With rapid development of semiconductor manufacturing technologies, semiconductor devices are moving in a direction toward higher component densities and higher integration. Semiconductor devices, as the most basic devices, are widely used. A traditional planar device has weak control of a channel current, resulting in short-channel effects and a leakage current, which ultimately affects electrical performance of a semiconductor device.

To overcome the short-channel effects of a device and suppress the leakage current, a conventional method proposes a fin field effect transistor (Fin FET), which is a common multi-gate device, and structures of the Fin FET include fins and an isolation structure on a surface of a semiconductor substrate, that the isolation structure covers a portion of sidewalls of the fins; a gate structure across and on the substrate; and source and drain regions in the fins on both sides of the gate structure.

With ever-increasing demands placed on device performance, a four-sided controlled gate-all-around structure has been created. A semiconductor device having a gate-all-around structure has special properties that effectively limit the short-channel effects, which is desperately desired in the industry innovation to continuously reduce a size of a device in accordance with Moore's Law. A device channel formed by a thin silicon film in a gate-all-around structure is surrounded by a gate of a device, and is only controlled by the gate.

There is a need to improve performance of a semiconductor device formed by a conventional method.

SUMMARY

One aspect of the present disclosure provides a fabrication method of a semiconductor device, including: providing a substrate; forming at least one sacrificial layer and at least one liner layer, that are alternately stacked over each other, on the substrate; etching the at least one sacrificial layer and the at least one liner layer, until the substrate is exposed, to form a plurality of fins, discretely arranged on the substrate; and after forming the plurality of fins, etching a portion of a thickness of the substrate, such that a width of the etched portion of the substrate at a bottom of the at least one sacrificial layer is less than a width of the at least one liner layer of the plurality of fins.

Another aspect of the present disclosure provides a semiconductor device. The semiconductor device includes a substrate. The substrate includes a plurality of raised portions. A plurality of fins is each formed on a raised portion of the plurality of raised portions of the substrate. A gate structure is formed across a top and sidewalls of a length portion of the plurality of fins. Each of the plurality of fins includes at least one liner layer. Each of the at least one liner layer is surrounded by the gate structure in a direction perpendicular to a surface of the substrate. The gate structure is further formed between the plurality of raised portions of the substrate and a liner layer of the at least one liner layer. Each of the plurality of raised portions of the substrate has a width less than a width of any of the at least one liner layer.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

What a conventional method of forming a gate-all-around structure generally uses is to form a dummy-gate structure across fins on a substrate, remove the dummy-gate structure and a portion of a sacrificial layer in the fins under the dummy-gate structure to form a conduit, and then form a gate dielectric with high dielectric constant and a metal gate to form the gate-all-around structure. But a parasitic capacitance at a bottom of a formed semiconductor device is large, and leakage easily occurs, resulting in poor usage performance and electrical performance of the semiconductor device. When the gate-all-around structure is formed, a width of the substrate at a bottom of the gate-all-around structure is large, therefore the gate-all-around structure's control ability on the substrate at the bottom is poor, which causes the bottom of the gate-all-around structure to have a large parasitic capacitance and a parasitic cap, and the formed semiconductor device to be prone to leakage and other phenomena, thereby affecting the usage performance of the semiconductor device.

An alternative conventional method of forming a semiconductor device is as follows.

Figure 1:
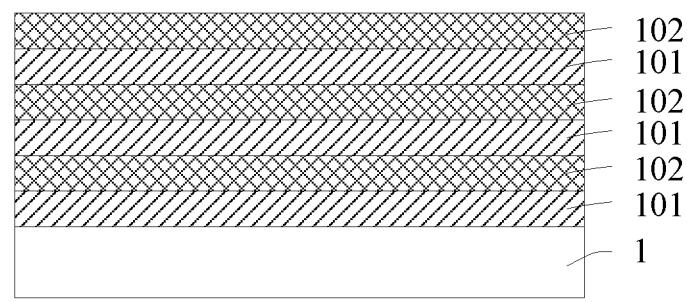
FIGS. 1 to 3 illustrate structures corresponding to certain stages during a conventional fabrication process of a semiconductor device.

Referring to FIG. 1, a substrate 1 is provided, on which a sacrificial layer 101 and a liner layer 102 are formed, and the sacrificial layer 101 and the liner layer 102 are alternately stacked over each other on the substrate 1.

Figure 2:
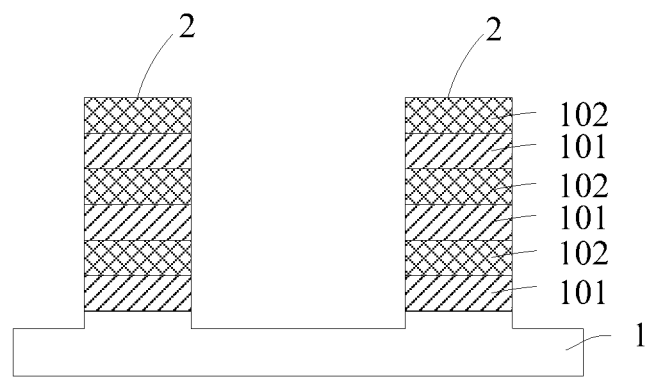

Referring to FIG. 2, the liner layer 102, the sacrificial layer 101, and a portion of a thickness of the substrate 1 are etched, to form a plurality of fins 2, discretely arranged on the substrate 1.

Figure 3:
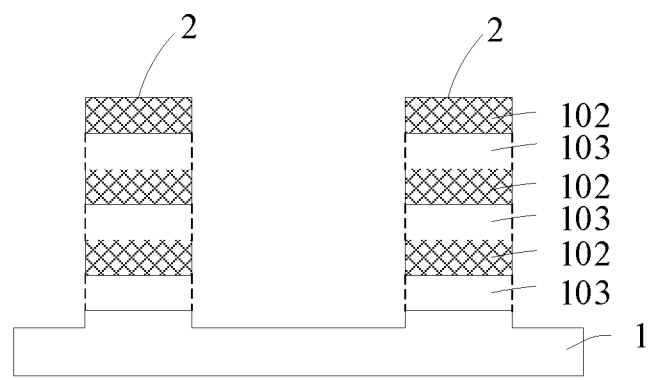

Referring to FIG. 3, the sacrificial layer 101 of the plurality of fins 2 is removed to form a conduit 103.

When a gate-all-around structure surrounding the plurality of fins 2 is formed, after the sacrificial layer 101 of the plurality of fins 2 is removed to form the conduit 103, because a width of the substrate 1 under the sacrificial layer 101 equals to a width of the liner layer 102 of the plurality of fins 2, the width of the substrate 1 at a bottom of the gate-all-around structure is large and the gate-all-around structure's control ability on the substrate 1 at the bottom is poor, which results in a large parasitic capacitance at the bottom of the gate-all-around structure, while causing the semiconductor device to be prone to problems such as leakage during use, thereby seriously affecting the usage performance of the semiconductor device.

The portion of the thickness of the substrate under the sacrificial layer can be etched so that the width of the substrate at the bottom of the sacrificial layer is smaller than the width of the liner layer of the plurality of fins. Therefore when the gate-all-around structure is formed, the width of the substrate at the bottom of the gate-all-around structure is smaller, control effect of the gate-all-around structure on the substrate is enhanced, a parasitic capacitance and a parasitic cap generated at the bottom of the gate-all-around structure are small, and AC characteristics of the semiconductor device are enhanced. Also, possibility of leakage of the semiconductor device during use is reduced, and the usage performance of the semiconductor device is improved.

The above-described objects, features and advantages of the present disclosure may become easier to be understood from the embodiments of the present disclosure described in detail below with reference to the accompanying drawings.

FIGS. 4 to 8 illustrate structures corresponding to certain stages during an exemplary fabrication process of a semiconductor device consistent with one embodiment of the present disclosure.

Figure 17:
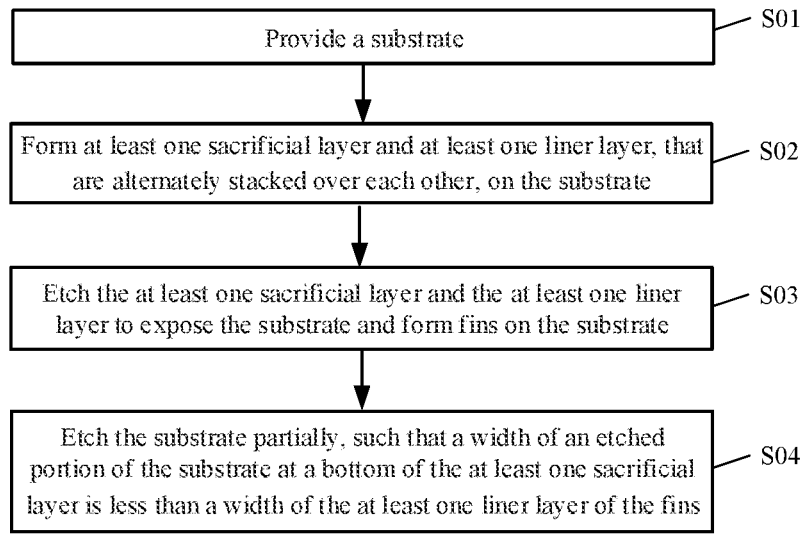
FIG. 17 illustrates an exemplary fabrication process of a semiconductor device consistent with various disclosed embodiments of the present disclosure.

FIG. 17 illustrates an exemplary fabrication process of a semiconductor device consistent with various disclosed embodiments of the present disclosure.

Figure 4:
FIGS. 4 to 8 illustrate structures corresponding to certain stages during an exemplary fabrication process of a semiconductor device consistent with one embodiment of the present disclosure.

Referring to FIG. 4, a substrate 200 is provided, according to S01 in FIG. 17.

In one embodiment, the substrate 200 is made of single crystal silicon. In other embodiments, the substrate 200 may be made of one of single crystal silicon, polysilicon, and amorphous silicon. The substrate 200 may also be made of a semiconductor material such as one of silicon, germanium, silicon germanium, gallium arsenide, and the like.

Figure 5:
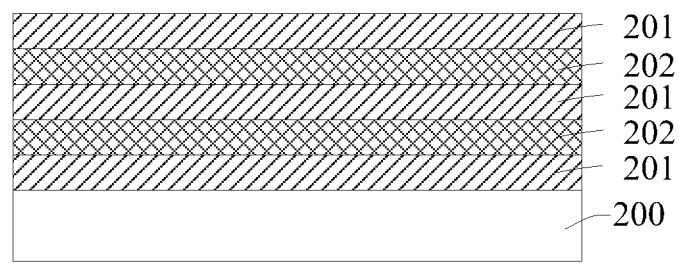

Referring to FIG. 5, at least one sacrificial layer 201 and at least one liner layer 202 are formed and alternately stacked over each other on the substrate 200, according to S02 in FIG. 17.

In one embodiment, three layers of the sacrificial layer 201 and two layers of the liner layer 202 are respectively formed. In other embodiments, the number of layers of the sacrificial layer 201 and the liner layer 202 formed is set according to actual requirements.

Starting with one layer of the sacrificial layer 201 on the substrate 200, the sacrificial layer 201 and the liner layer 202 are alternately stacked over each other on the substrate 200.

In one embodiment, the sacrificial layer 201 is made of silicon germanium (SiGe). In other embodiments, the sacrificial layer 201 may also be made of one or more of silicon, germanium, and gallium arsenide.

In one embodiment, the liner layer 202 is made of silicon. In other embodiments, the liner layer 202 may also be made of one or more of germanium, silicon germanium, and gallium arsenide.

In one embodiment, the sacrificial layer 201 and the liner layer 202 are formed on the substrate 200 by an epitaxial growth method.

In other embodiments, the sacrificial layer 201 and the liner layer 202 may be formed on the substrate 200 by one of an ion doping method and a chemical vapor deposition method.

In one embodiment, process parameters for forming the sacrificial layer 201 include using silane ($SiH_4$) and germane ($GeH_4$) as ambient atmosphere, that a gas percentage ratio of silane ($SiH_4$) and germane ($GeH_4$) is controlled to be between about 20% and about 50%, a pressure range is between about 1 torr and about 100 torr, a temperature is between about 400° C. and about 600° C., and a reaction time is controlled to be between about 10 minutes and about 1 hour.

In one embodiment, process parameters for forming the liner layer 202 include using silane ($SiH_4$) as ambient atmosphere, that a gas flow rate of the $SiH_4$ gas is between about 10 sccm and about 700 sccm, a pressure range is between about 1 torr and about 100 torr, a temperature is between about 400° C. and about 600° C., and a reaction time is controlled to be between about 10 minutes and about 1 hour.

Figure 6:
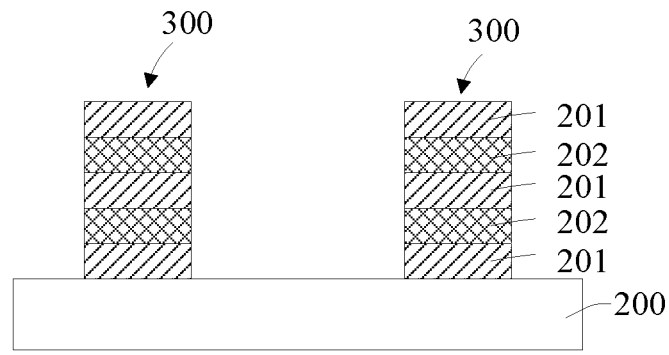

Referring to FIG. 6, the liner layer 202 and the sacrificial layer 201 are etched to expose the substrate 200, and a plurality of discretely arranged fins 300 is formed on the substrate 200, according to S03 in FIG. 17.

In one embodiment, the liner layer 202 and the sacrificial layer 201 are dry-etched to form the plurality of discretely arranged fins 300 on the substrate. In other embodiments, wet etching may also be used to etch the liner layer 202 and the sacrificial layer 201 to form the plurality of discretely arranged fins 300 on the substrate.

In one embodiment, process parameters for dry etching the liner layer 202 and the sacrificial layer 201 include: etching gases used include HBr and Ar, that a flow rate of HBr is between about 10 sccm and about 1000 sccm, and a flow rate of Ar is between about 10 sccm and about 1000 sccm.

Figure 7:
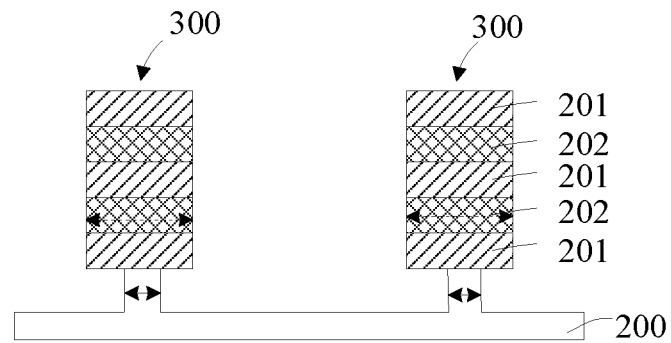

Referring to FIG. 7, a portion of a thickness of the substrate 200 is etched, and a width of the etched portion of the substrate 200 at a bottom of the sacrificial layer 201 is smaller than a width of the liner layer 202 of the plurality of discretely arranged fins 300, according to S04 in FIG. 17. As shown in FIG. 7, the etched portion is also referred to as a raised portion of the substrate.

In one embodiment, a direction of the width is a direction parallel to a surface of the substrate and perpendicular to an extension direction of the plurality of discretely arranged fins, that a solid line represents the width of the substrate 200 at the bottom of the sacrificial layer 201, a dotted line indicates the width of the liner layer 202 of the plurality of discretely arranged fins 300, and a length of the solid line and the dotted line indicates a size of the width.

In one embodiment, the portion of the thickness of the substrate 200 is etched so that the width of the etched portion of the substrate 200 at the bottom of the sacrificial layer 201 is smaller than the width of the liner layer 202 of the plurality of discretely arranged fins 300. Therefore, when a gate-all-around structure is formed subsequently, control effect of the gate-all-around structure on the substrate at the bottom is enhanced to ensure that a smaller parasitic capacitance and a parasitic cap are generated at the bottom of the gate-all-around structure, thereby improving the AC characteristics of the semiconductor device. At a same time, it can reduce a leakage of the semiconductor device during use, and improve electrical performance of the semiconductor device.

In one embodiment, the portion of the thickness of the substrate 200 is etched by using a wet etching method. In other embodiments, the portion of the thickness of the substrate 200 may be dry-etched.

A semiconductor device formed by using the above method includes: a substrate 200, and a plurality of fins 300 discretely arranged on the substrate 200. Each of the plurality of fins 300 includes at least one sacrificial layer 201 and at least one liner layer 202. Starting with one layer of the at least one sacrificial layer 201 on the substrate 200, the at least one sacrificial layer 201 and the at least one liner layer 202 are stacked over each other on the substrate 200. A width of an etched portion of the substrate 200 at a bottom of the sacrificial layer 201 is smaller than a width of the liner layer 202.

Figure 8:
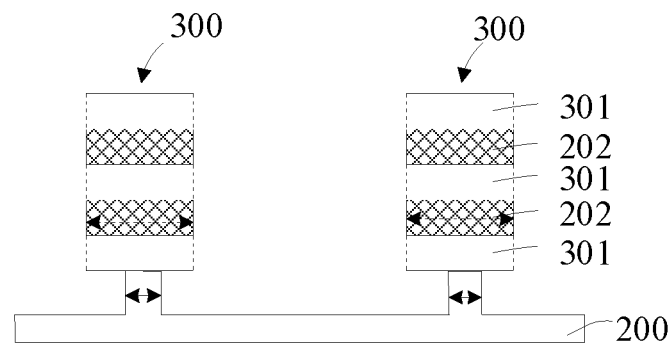

Referring to FIG. 8, a portion of the sacrificial layer 201 of the plurality of fins 300 is removed, and a conduit 301 is formed to replace the removed sacrificial layer 201 in the plurality of fins 300. A process including removing a portion of the sacrificial layer 201 may include: forming a dummy gate structure across the plurality of fins 300, such that the dummy gate structure covers a portion of a top surface and side walls of the plurality of fins 300; forming openings in the plurality of fins on both sides of the dummy gate structure; forming source-drain doped regions in the openings; forming a dielectric layer on the substrate 200 and the plurality of fins 300, such that the dielectric layer covers sides of the dummy gate structure; removing the dummy gate structure to form a gate opening in the dielectric layer, such that the gate opening exposes a portion of the sacrificial layer 201 and a portion of the liner layer 202; and removing the portion of the sacrificial layer 201 exposed by the gate opening to form a conduit 301, such that the conduit 301 and the gate opening pass through, and a gate structure can be formed in the conduit 301 and the gate opening. In one embodiment, a purpose to remove the sacrifice layer 201 and form the conduit 301 in the plurality of fins 300 is to form a gate-all-around structure surrounding the plurality of fins 300 when a gate structure is subsequently formed such that the gate structure across the plurality of fins 300 covers a portion of a top surface and side walls of the plurality of fins 300, and surrounds the liner layer 202. The gate-all-around structure has a longest effective gate width in a same space, so that usage performance of the formed semiconductor device is improved.

In one embodiment, since the width of the etched portion of the substrate 200 at the bottom of the sacrificial layer 201 is smaller than the width of the liner layer 202 of the plurality of fins 300, the formed gate-all-around structure has good control effect on the substrate 200 at the bottom, and there is less parasitic capacitance and parasitic caps formed at the bottom of the gate-all-around structure, which enhances the AC characteristics of the formed semiconductor device, solves a leakage problem of the semiconductor device during use, and improves the electrical performance of the semiconductor device.

In one embodiment, a portion of the sacrificial layer 201 is removed by using a dry etching process. Parameters of the dry etching process include: a total gas used includes an etching gas and a diluent gas, that the etching gas includes HCl, the diluent gas includes $N_2$, a molar percentage of the etching gas in the total gas is between about 20% and about 90%, and a temperature is between about 100° C. and about 200° C.

FIGS. 9 to 16 illustrate structures corresponding to certain stages during an exemplary fabrication process of a semiconductor device consistent with another embodiment of the present disclosure.

Figure 18:
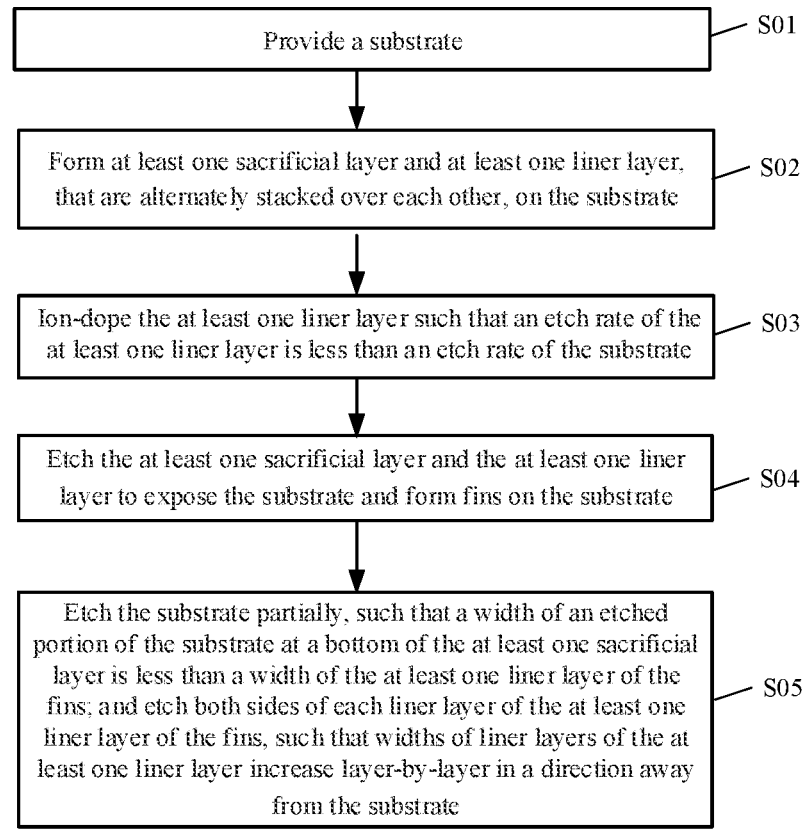
FIG. 18 illustrates another exemplary fabrication process of a semiconductor device consistent with various disclosed embodiments of the present disclosure.

FIG. 18 illustrates another exemplary fabrication process of a semiconductor device consistent with various disclosed embodiments of the present disclosure.

Figure 9:
FIGS. 9 to 16 illustrate structures corresponding to certain stages during an exemplary fabrication process of a semiconductor device consistent with another embodiment of the present disclosure.

Referring to FIG. 9, a substrate 200 is provided, according to S01 in FIG. 18.

In one embodiment, the substrate 200 is made of silicon. In other embodiments, the substrate 200 may also be made of a semiconductor material such as one of silicon germanium, germanium, gallium arsenide, and the like.

Figure 10:
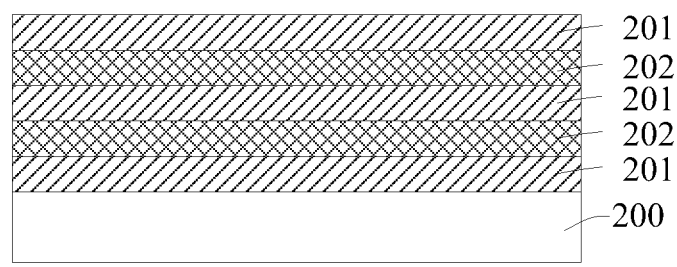

Referring to FIG. 10, at least one sacrificial layer 201 and at least one liner layer 202 are formed and alternately stacked over each other on the substrate 200, according to S02 in FIG. 18.

In one embodiment, three layers of the sacrificial layer 201 and two layers of the liner layer 202 are respectively formed. In other embodiments, the number of layers of the sacrificial layer 201 and the liner layer 202 formed is set according to actual requirements.

In one embodiment, a process of forming the sacrificial layer 201 and the liner layer 202 is the same as foregoing embodiments. In other embodiments, different processes may be used to form the sacrificial layer 201 and the liner layer 202 on the substrate 200.

In one embodiment, the sacrificial layer 201 is made of silicon germanium (SiGe). In other embodiments, the sacrificial layer 201 may also be made of one or more of silicon, germanium, and gallium arsenide.

In one embodiment, the liner layer 202 is made of silicon. In other embodiments, the liner layer 202 may also be made of one or more of germanium, silicon germanium, and gallium arsenide.

Figure 11:
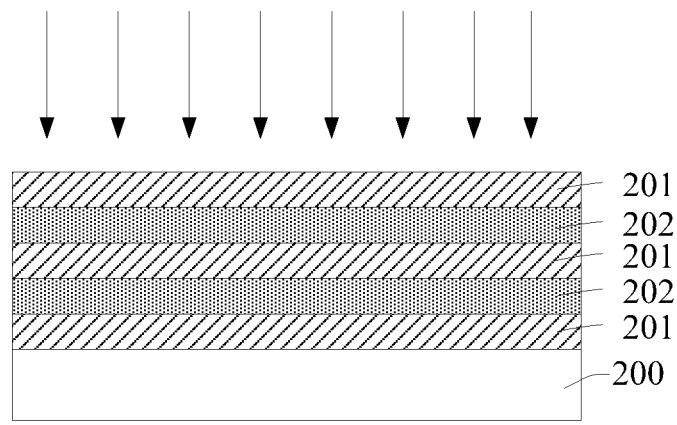

Referring to FIG. 11, ions are ion-doped into the liner layer 202 by using an ion doping method, so that an etch rate of the liner layer 202 is smaller than an etch rate of the substrate, according to S03 in FIG. 18.

An arrow direction in FIG. 11 indicates a flow direction of the ions.

In one embodiment, the ions used in the ion doping method include one of boron ions, phosphorus ions, and arsenic ions.

In other embodiments, the liner layer 202 having an etch rate smaller than that of the substrate 200 may be directly formed on the substrate 200.

Figure 12:
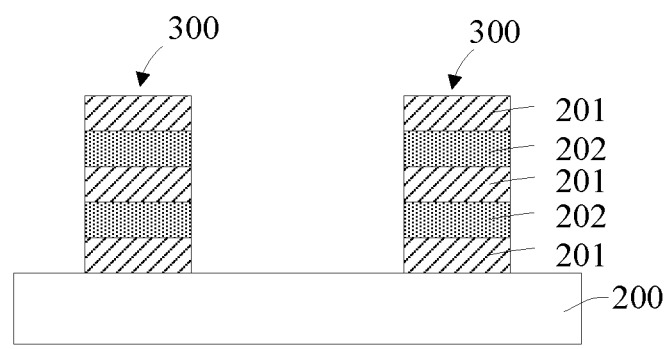

Referring to FIG. 12, the liner layer 202 and the sacrificial layer 201 are etched until the substrate 200 is exposed, and a plurality of discretely arranged fins 300 is formed on the substrate 200, according to S04 in FIG. 18.

In one embodiment, the liner layer 202 and the sacrificial layer 201 are etched by using a self-aligned dual patterning process (SADP) to form the plurality of discretely arranged fins 300 on the substrate 200. In other embodiments, the plurality of discretely arranged fins 300 may be formed without using the SADP.

In one embodiment, a hard mask layer is not formed on the sacrificial layer 201 at a top layer. In other embodiments, a hard mask layer may also be formed on the sacrificial layer 201 at the top layer to protect quality of a surface of the sacrificial layer 201, in a subsequent etching process.

Figure 13:
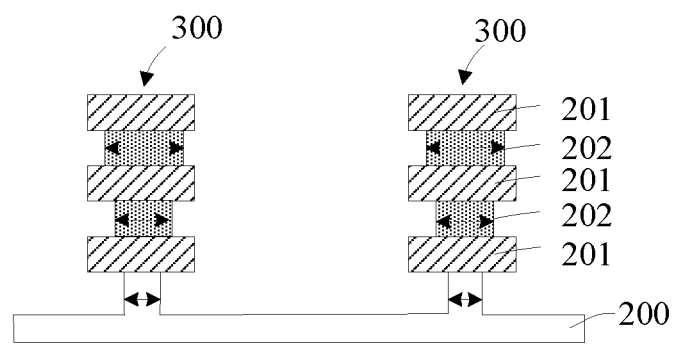

Referring to FIG. 13, a portion of a thickness of the substrate 200 is etched, and a width of the etched portion of the substrate 200 at a bottom of the sacrificial layer 201 is smaller than a width of the liner layer 202 of the plurality of discretely arranged fins 300, according to S05 in FIG. 18. At a same time, both sides of the liner layer 202 of the plurality of discretely arranged fins 300 are etched, and the width of the liner layer 202 after etching increases layer-by-layer in a direction away from the substrate 200.

A direction of the width is a direction parallel to a surface of the substrate and perpendicular to a fin extension direction. A solid line in FIG. 13 indicates the width of the substrate, a dotted line indicates the width of the liner layer, and a length of the solid line and the dotted line indicates a size of the width.

In one embodiment, a step of etching the portion of the thickness of the substrate 200 so that the width of the etched portion of the substrate 200 at the bottom of the sacrificial layer 201 is smaller than the width of the liner layer 202 of the plurality of discretely arranged fins 300 is performed simultaneously with a step of etching both sides of the liner layer 202 of the plurality of discretely arranged fins 300 so that the width of the liner layer 202 after etching increases layer-by-layer in the direction away from the substrate 200. Therefore, the ion doping method is used to change the etch rate of the liner layer 202 so that the etch rate of the liner layer 202 is smaller than the etch rate of the substrate 200.

In other embodiments, the step of etching the portion of the thickness of the substrate 200 so that the width of the etched portion of the substrate 200 at the bottom of the sacrificial layer 201 is smaller than the width of the liner layer 202 of the plurality of discretely arranged fins 300 is not performed simultaneously with the step of etching both sides of the liner layer 202 of the plurality of discretely arranged fins 300 so that the width of the liner layer 202 after etching increases layer-by-layer in the direction away from the substrate 200. In this way, material properties of the liner layer 202 may or may not be changed, and an order of execution of the two steps may be set according to actual needs, and there is no particular prescribed sequence.

When the step of etching both sides of the liner layer 202 of the plurality of discretely arranged fins 300 so that the width of the liner layer 202 after etching increases layer-by-layer in the direction away from the substrate 200 is performed after the step of etching the portion of the thickness of the substrate 200 so that the width of the etched portion of the substrate 200 at the bottom of the sacrificial layer 201 is smaller than the width of the liner layer 202 of the plurality of discretely arranged fins 300, it is sufficient to form a protective layer on the substrate 200 after being etched. The protective layer can be removed after the step of etching both sides of the liner layer 202 of the plurality of discretely arranged fins 300 so that the width of the liner layer 202 after etching increases layer-by-layer in the direction away from the substrate 200. At this time, the material properties of the liner layer 202 need not be changed, but the process is complicated, and cost is high.

In other embodiments, a liner layer 202 having an etch rate smaller than that of the substrate 200 may be directly formed on the substrate 200.

In one embodiment, a wet etching process is used to etch the substrate 200 and both sides of the liner layer 202 of the plurality of discretely arranged fins 300. Tetramethylammonium hydroxide (TMAH) is an etching solution used in the wet etching process, which guarantees that the sacrificial layer 201 is not affected when the substrate 200 and both sides of the liner layer 202 of the plurality of discretely arranged fins 300 are etched.

In one embodiment, on one hand, the portion of the thickness of the substrate 200 is etched so that the width of the etched portion of the substrate 200 at the bottom of the sacrificial layer 201 is smaller than the width of the liner layer 202 of the plurality of discretely arranged fins 300. Therefore, when a gate-all-around structure is formed subsequently, because the width of the etched portion of the substrate 200 at the bottom of the gate-all-around structure is smaller, control effect of the gate-all-around structure on the substrate at the bottom is enhanced to ensure that a smaller parasitic capacitance and a parasitic cap are generated at the bottom of the gate-all-around structure, thereby improving the AC characteristics of the semiconductor device. On the other hand, both sides of the liner layer 202 of the plurality of discretely arranged fins 300 are etched so that the width of the liner layer 202 after etching increases layer-by-layer in the direction away from the substrate 200, so that the semiconductor device formed subsequently has good electrical sensitivity. Because the liner layer 202 at a top layer has a larger width, and the liner layer 202 at a bottom layer has a smaller width, which can make the semiconductor device to have a larger turn-on current when the semiconductor device starts, and a smaller closing current when the semiconductor device is turned off, so that the usage performance of the semiconductor device is improved.

A semiconductor device formed by the above method includes a substrate 200, and a plurality of fins 300 discretely arranged on the substrate 200. Each of the plurality of fins 300 includes at least one sacrificial layer 201, ions, and at least one liner layer 202. Starting with one layer of the at least one sacrificial layer 201 on the substrate 200, the at least one sacrificial layer 201 and the at least one liner layer 202 are alternately stacked over each other on the substrate 200, and the ions are ion-doped in the liner layer 202. A width of an etched portion of the substrate 200 at a bottom of the sacrificial layer 201 is smaller than a width of the liner layer 202, and the width of the liner layer 202 increases layer-by-layer in a direction away from the substrate 200.

Figure 14:
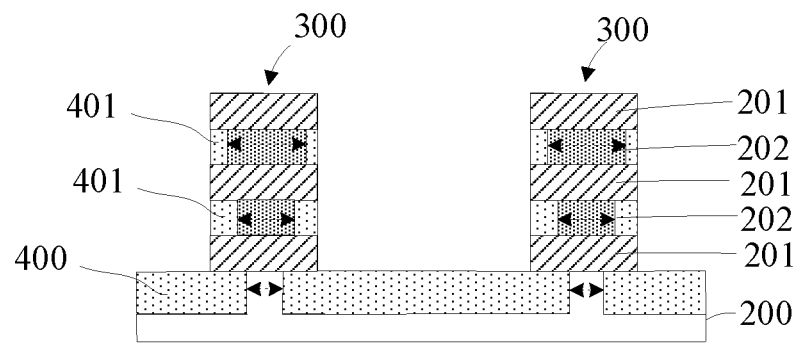

Referring to FIG. 14, an isolation structure 400 is formed on the substrate 200, and the isolation structure 400 covers the etched portion of the substrate 200. In one embodiment, an isolation wall 401 is formed to cover an etched portion of the liner layer 202 of the plurality of fins 300.

In one embodiment, the isolation structure 400 is a shallow trench isolation structure (STI). In other embodiments, the isolation structure 400 may not be formed on the substrate 200.

Figure 15:
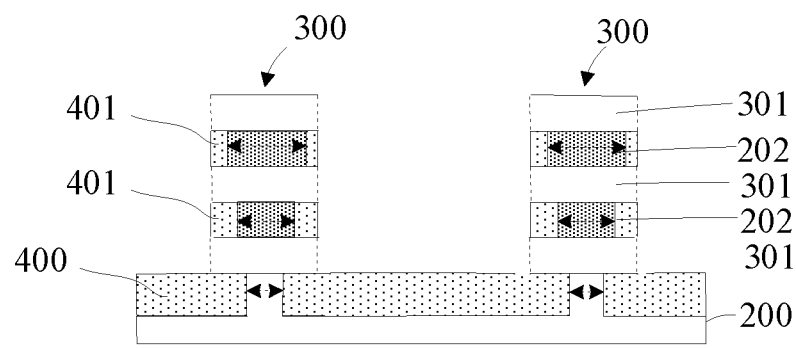

Referring to FIG. 15, a portion of the sacrificial layer 201 of the plurality of fins 300 is removed, and a conduit 301 is formed in the plurality of fins 300 to replace the removed sacrificial layer 201. A process including removing a portion of the sacrificial layer 201 may include: forming a dummy gate structure across the plurality of fins 300, such that the dummy gate structure covers a portion of a top surface and side walls of the plurality of fins 300; forming openings in the plurality of fins on both sides of the dummy gate structure; forming source-drain doped regions in the openings; forming a dielectric layer on the substrate 200 and the plurality of fins 300, such that the dielectric layer covers sides of the dummy gate structure; removing the dummy gate structure to form a gate opening in the dielectric layer, such that the gate opening exposes a portion of the sacrificial layer 201 and a portion of the liner layer 202; and removing the portion of the sacrificial layer 201 exposed by the gate opening to form a conduit 301, such that the conduit 301 and the gate opening pass through, and a gate structure can be formed in the conduit 301 and the gate opening.

Figure 16:
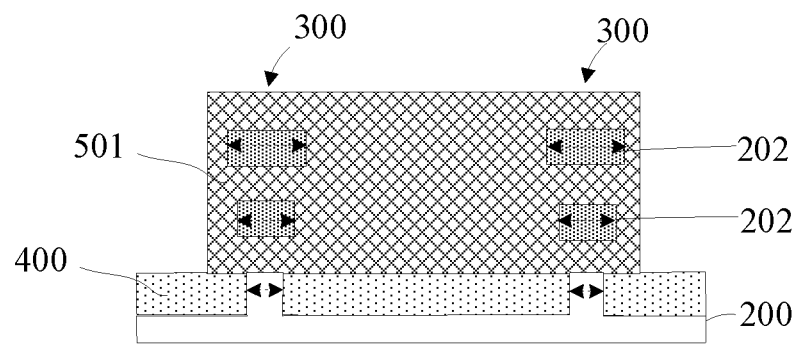

In one embodiment, referring to FIG. 16, a purpose to remove the sacrifice layer 201 and form the conduit 301 in the plurality of fins 300 is to form a gate-all-around structure. For example, a gate structure 501 may be subsequently formed across the plurality of fins 300 to cover a top surface and sidewalls of a length portion of each fin 300. The gate structure 501 may further surround each liner layer 202 in a direction perpendicular to a surface of the substrate 200. For example, the gate structure 501 may be formed in the conduit(s) 301 between adjacent liner layers 202. The gate structure 501 may further be formed between the raised (or etched) portions of the substrate 200 and a liner layer 202 in a close proximity of the substrate 200. The raised portion may have a width less than (or equals to) a width of any liner layer 202. In some embodiments, widths of liner layers may be the same. In other embodiments, widths of liner layers may increase layer-by-layer in a direction away from the substrate. Referring back to FIG. 16, the isolation structure 400 may be formed on the substrate 200 and cover sidewalls of the raised portion(s) of the substrate 200. The gate structure 501 may be further formed on the isolation structure 400.

Compared with existing technologies, the technical solution of the present disclosure has the following advantages.

The portion of the thickness of the substrate is etched such that the width of the etched portion of the substrate at the bottom of the sacrificial layer is less than the width of the liner layer of the plurality of fins, so when the sacrificial layer of the plurality of fins is removed in a subsequent process to form a gate-all-around structure surrounding the plurality of fins, since the width of the etched portion of the substrate at the bottom of the gate-all-around structure is smaller, the control effect of the gate-all-around structure on the substrate at the bottom is enhanced, the parasitic cap and the parasitic capacitance generated at the bottom of the gate-all-around structure are reduced, and the possibility of a leakage current is reduced, thereby enhancing the usage performance of the formed semiconductor device, and improving the performance stability of the semiconductor device.

Further, both sides of the liner layer of the plurality of fins are etched, and the width of the liner layer after etching increases layer-by-layer in a direction away from the substrate. The width of the liner layer at a bottom layer is the smallest, the width of the liner layer at a top layer is the largest, and the width of the liner layer increases layer-by-layer in the direction away from the substrate, so that the subsequently formed semiconductor device has a sharp electrical sensing property. When the semiconductor device is turned on, a large current can be generated. When the semiconductor device is turned off, a small current can be generated. The performance of the semiconductor device is improved.

The embodiments disclosed herein are exemplary only. Other applications, advantages, alternations, modifications, or equivalents to the disclosed embodiments that are obvious to those skilled in the art are intended to be encompassed within the scope of the present disclosure.

What is claimed is:

1. A fabrication method of a semiconductor device, comprising:
providing a substrate;
forming at least one sacrificial layer and at least one liner layer, the at least one sacrificial layer and the at least one liner layer being alternately stacked over each other, on the substrate;
etching the at least one sacrificial layer and the at least one liner layer until the substrate is exposed, to form a plurality of fins, discretely arranged on the substrate; and
after forming the plurality of fins, etching a portion of a thickness of the substrate, such that in a direction perpendicular to an extension direction of the plurality of fins, a width of a remaining portion of the thickness of the substrate below the at least one sacrificial layer is less than a width of the at least one liner layer of the plurality of fins.

2. A fabrication method of a semiconductor device, comprising:
providing a substrate;
forming at least one sacrificial layer and at least one liner layer, that are alternately stacked over each other, on the substrate;
etching the at least one sacrificial layer and the at least one liner layer until the substrate is exposed, to form a plurality of fins, discretely arranged on the substrate;
after forming the plurality of fins, etching a portion of a thickness of the substrate, such that a width of the etched portion of the substrate at a bottom of the at least one sacrificial layer is less than a width of the at least one liner layer of the plurality of fins, and
etching both sides of each liner layer of the at least one liner layer of the plurality of fins, such that, the at least one liner layer includes a plurality of liner layers, widths of the plurality of liner layers increase layer-by-layer in a direction away from the substrate.

3. The method according to claim 2, before forming the plurality of fins on the substrate, further including:
ion-doping the at least one liner layer such that an etch rate of the at least one liner layer is less than an etch rate of the substrate.

4. The method according to claim 3, wherein:
the at least one liner layer is made of one or more of silicon, germanium, silicon germanium, and gallium arsenide.

5. The method according to claim 3, wherein:
ions used for ion-doping the at least one liner layer include one of boron ions, phosphorus ions, and arsenic ions.

6. The method according to claim 1, wherein:
the at least one sacrificial layer is made of one or more of silicon, germanium, silicon germanium, and gallium.

7. The method according to claim 1, after etching the portion of the thickness of the substrate, further including:
removing a portion of the at least one sacrificial layer from the plurality of fins; and
forming at least one conduit in the plurality of fins to replace the removed portion of the at least one sacrificial layer.

8. The method according to claim 7, before removing a portion of the at least one sacrificial layer and forming the at least one conduit in the plurality of fins, further including:
forming an isolation structure on the substrate, wherein the isolation structure covers the etched portion of the substrate.

9. The method according to claim 8, further including:
  forming an isolation wall covering the etched portion of the at least one liner layer of the plurality of fins.

10. The method according to claim 2, further including:
  using a wet etching process to etch the portion of the thickness of the substrate and the both sides of each liner layer of the at least one liner layer of the plurality of fins.

11. The method according to claim 2, wherein:
  the at least one sacrificial layer is made of one or more of silicon, germanium, silicon germanium, and gallium.

12. The method according to claim 2, after etching the portion of the thickness of the substrate, further including:
  removing a portion of the at least one sacrificial layer from the plurality of fins; and
  forming at least one conduit in the plurality of fins to replace the removed portion of the at least one sacrificial layer.

13. The method according to claim 12, before removing a portion of the at least one sacrificial layer and forming the at least one conduit in the plurality of fins, further including:
  forming an isolation structure on the substrate, wherein the isolation structure covers the etched portion of the substrate.

14. The method according to claim 13, further including:
  forming an isolation wall covering the etched portion of the at least one liner layer of the plurality of fins.

\* \* \* \* \*